United States Patent
Achari et al.

(10) Patent No.: US 6,459,041 B1
(45) Date of Patent: Oct. 1, 2002

(54) ETCHED TRI-LAYER METAL BONDING LAYER

(75) Inventors: Achyuta Achari, Canton, MI (US); Lakhi Nandlal Goenka, Ann Arbor, MI (US); Mohan R. Paruchuri, Canton, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/703,815

(22) Filed: Nov. 1, 2000

(51) Int. Cl.[7] ............................................... H01B 7/08
(52) U.S. Cl. ............................... 174/117 F; 174/117 FF
(58) Field of Search ..................... 174/117 F, 117 FF, 174/125.1, 126.1, 126.2, 250, 255, 256, 259

(56) References Cited

U.S. PATENT DOCUMENTS

| | | | | |
|---|---|---|---|---|
| 1,193,667 A | * | 8/1916 | Corey | 174/126.2 |
| 1,679,518 A | * | 8/1928 | Fowle | 174/126.2 |
| 2,984,894 A | * | 5/1961 | Hill | 174/126.2 |
| 3,248,681 A | * | 4/1966 | Reintgen | 174/126.1 |
| 3,473,217 A | * | 10/1969 | Prior | 174/125.1 |
| 3,801,388 A | | 4/1974 | Akiyama et al. | 156/3 |
| 4,404,059 A | | 9/1983 | Livshits et al. | 156/629 |
| 5,738,797 A | | 4/1998 | Belke, Jr. et al. | 216/16 |

* cited by examiner

Primary Examiner—Chau N. Nguyen
(74) Attorney, Agent, or Firm—John E. Kajander

(57) ABSTRACT

A tri-metallic material for use in the manufacture of printed circuit boards is described, and the process for its manufacture is described. The tri-metallic material is a sandwich wherein a copper layer is essential the "bread" of the sandwich and an aluminum layer is the filling between both slices of bread. A metallic bonding and/or barrier layer is spread on the aluminum and is selected for its highly non-corrosive properties as well as its bonding, and diffusion inhibiting capabilities.

5 Claims, 1 Drawing Sheet

ETCHED TRI-LAYER METAL BONDING LAYER

FIELD OF THE INVENTION

This invention relates generally to circuit boards and more particularly to a tri-metallic material construction for use in Etched-Tri-Metal, "ETM", multi-layer circuit boards.

DESCRIPTION OF THE RELATED ART

In the field of electronics manufacturing, various additive and subtractive processes are known for constructing printed circuit boards (PCBs). Among these are the processes disclosed in U.S. Pat. No. 3,801,388 issued Apr. 2, 1974 to Akiyama et al. which is a subtractive process. U.S. Pat. No. 4,404,059 issued Sep. 13, 1983 to Livshits et al is an additive process. U.S. Pat. No. 5,738,797 issued Apr. 14, 1998 to Belke, Jr. et al is assigned to a common assignee. All three of which are incorporated herein by reference. These patents describe various additive and subtractive plating and chemical etching processes for constructing multi-layer PCBs having air bridges.

Currently tri-metallic materials as used in the manufacture of PCBs are a sandwich of aluminum as the middle layer and copper as the top and bottom layers. The layers are typically bonded together with a zinc bonding layer. Due to the anodic nature of zinc relative to copper and its position in the Electromotive Force Series, EMF series, the zinc layer is prone to corrosion.

SUMMARY OF THE INVENTION

It is a principal advantage of the tri-metallic material of the present invention to provide a bonding layer between the middle or first layer and each of the top and bottom or second and third layers that is substantially resistant to corrosion.

It is still another advantage to provide a bonding layer that has excellent adhesion properties between the middle or first layer and each of the top and bottom or second and third layers.

It is still another advantage to provide a barrier layer that has excellent properties to prevent diffusion between the middle and either or both the second and third layers.

These and other advantages will become apparent from the tri-metallic material for use in multi-layer printed circuit boards having a first metallic layer with spaced-apart top and bottom broadsides. A second and third metallic layers having spaced-apart top and bottom broadsides for overlying the first layer. A metallic bonding layer is deposited on the top and bottom broadsides of the first metallic layer that is sandwiched between the second and third metallic layers. The bonding layer bonds the second and third metallic layers to the top and bottom broadsides respectively of the first metallic layer.

In the preferred embodiment the first metallic layer is aluminum and the second and third metallic layers are copper with the bonding layer being a noble metal. In particular the bonding layer in one embodiment is immersion tin deposited on the broadside surfaces of the aluminum. A thin layer of nickel is deposited on the tin, and a copper layer is plated on the nickel layer.

If a barrier layer is desired, to prevent diffusion between layers, the process is the same as is the material of the layer. However some metals function better as a diffusion barrier than they do as a bonding layer.

DETAILED DESCRIPTION OF THE PREFERRED EMBODIMENT

Figure 1:
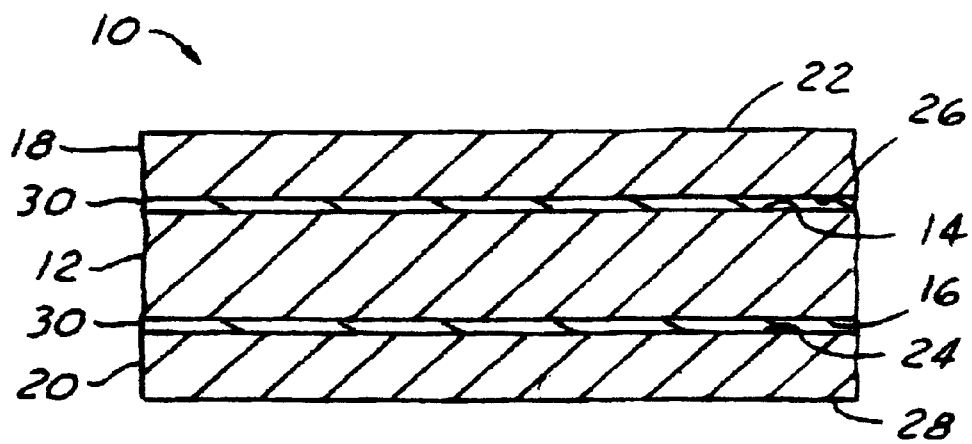
FIG. 1 is a cross-section of one embodiment of an etched tri-metal material fabricated according to the present invention.

Referring to the Figs by characters of reference there is illustrated in FIG. 1 a cross-section of the tri-metallic material 10, or sandwich, as used in multi-layer printed circuit boards. The tri-metallic material 10 has a first metallic layer 12 with spaced-apart top 14 and bottom 16 broadsides. Second 18 and third 20 metallic layers having spaced-apart top 22, 24 and bottom 26, 28 broadsides for overlying the first layer. A metallic seed 30 or barrier 32 layer is deposited on the top 14 and bottom 16 broadsides of the first metallic layer 12 that is sandwiched between the second 18 and third 20 metallic layers. The bonding layer 30 bonds the second and third metallic layers to the top 14 and bottom 16 broadsides respectively of the first metallic layer 12.

In the present embodiments, the term "barrier layer" is a layer 32 that prevents diffusion from one layer to the other and the term "bonding layer" is a layer 30 that helps in the boding between the layers on either side. Both seed and barrier layers 30, 32 are on the order of less than ten microns thick, while the first metal layer 12 in the tri-metallic material 10 is typically approximately one hundred fifty microns thick and the second 18 and third 20 layers are approximately fifty microns thick. The phrases bonding layer and barrier layer are used herein interchangeably.

In the preferred embodiment the first metallic layer 12 is aluminum and the second 18 and third 20 metallic layers are copper with the bonding layer 30 being a noble metal. In one embodiment the bonding layer 30 is immersion tin deposited on the broadside surfaces 14, 16 of the aluminum. A thin layer or strike of nickel is deposited on the tin, and the second 18 or third 20 layer, a copper layer is plated on the nickel layer.

In the alternative the bonding layer 30 can be tin (Sn), silver (Ag), rhodium, palladium, platinum, (Pt) or gold (Au). Each of these materials is highly resistant to corrosion as indicated on the Electromotive Force Series, "EMF". But the use of such materials is expensive in the manufacturing process, not only for the material itself but also the process.

Various metal alloys such as bronze (copper-tin) and brass can be used as the bonding layer 30. Each of these alloys is immersion coated onto the aluminum, which would be the first metallic layer. These alloys exhibit good corrosion resistance and have good adhesion with the aluminum layer.

As a barrier layer 32, the preferred metals are chromium, rhodium, palladium and platinum. The preferred alloys are zinc-nickel, cobalt-zinc and nickel-tin.

However it is to be understood that any of the previous metals, be it used for a bonding layer 30 or a barrier layer 32 contains properties that will function both as a bonding layer and a barrier layer. However, the lists in the previous paragraphs indicate those preferred metals to use if only a seed 30 or barrier 32 layer is wanted.

In the alternative, the bonding layer 30 may be coated on the second 18 and third 20 metallic layers. In an alternative embodiment, all of the metal layers are sheets of metal that have substantially the same broadside area.

A method for bonding aluminum and copper in the etched tri-metallic material has the steps of initially securing first 12, second 18 and third 20 metallic strips having spaced-apart top 14, 22, or 24 and bottom 16, 26, or 28 broadsides. The first, second and third strip broadsides have substantially identical planar areas.

In FIG. 1 a metallic bonding layer 30 or a barrier layer 32 is deposited on both, top 14 and bottom 16 broadside surfaces of the first strip 12. In the alternative the metallic bonding layer 30 is deposited on one broadside surface 26, 24 of each of the second 18 and third 20 strips.

Figure 2:
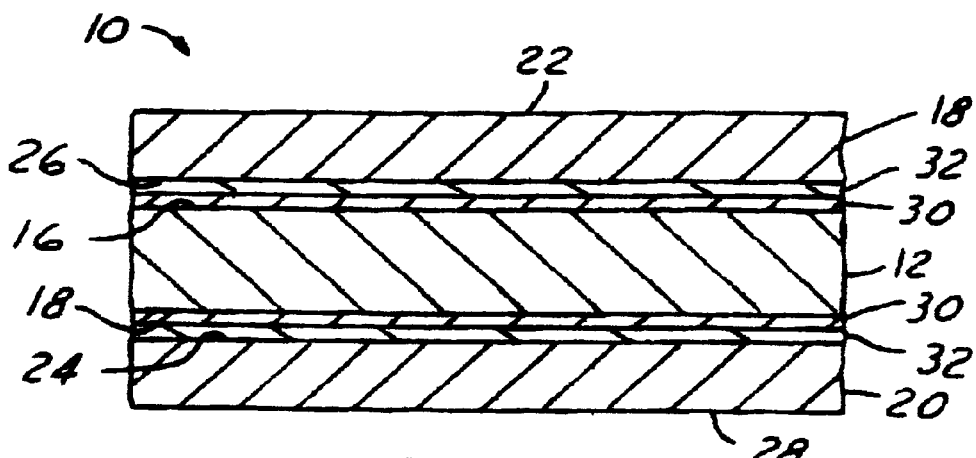
FIG. 2 is a cross-section of another embodiment.

In FIG. 2, typically a barrier layer 32 is deposited on the bottom surface 26 of the second 18 layer 18 and the top surface 24 of the third 20 layer and over the barrier layer 32 is a bonding layer is deposited. As illustrated the bonding layer is directly in contact with the first layer 12, however, either the seed or barrier layer can be in direct contact with the first layer.

Figure 3:
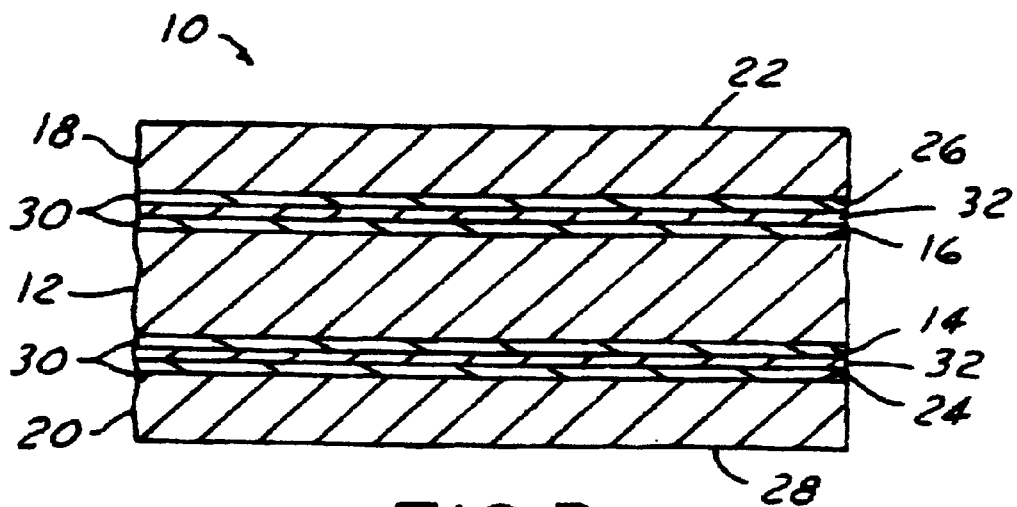
FIG. 3 is a cross-section of yet another embodiment.

In FIG. 3 a barrier layer 32 is sandwiched between two bonding layers 30. In turn this sandwich 32-30-32, is located between the first strip 12 and either the second 18 or their strip 20.

The three strips 12, 18, 20 are then formed into a sandwich wherein the second 18 and third 20 strip overlie respectively the top 14 and bottom 16 broadsides of the first strip 12, such that the bonding layer 30 or barrier layer 32 are not exposed. The sandwich is then activated by a heat treatment or cladding for bonding the mating broadside surfaces of the three strips forming a unitary structure.

The first strip 12 is aluminum and the second 18 and third 20 strips are copper. Typically, the metallic bonding layer 30 or barrier layer 32, are deposited on the both 14,16 broadsides of the aluminum strip. Depositing is by the process of immersion of both of the broadsides of the aluminum strip or one of the broadside surfaces of the second 18 or third 20 strips which are both copper, with the metallic bonding layer 30.

The step of activating is by means of heat-treating the sandwich 10 at predetermined temperatures and pressures. In the alternative the step of activating is by means of cladding the sandwich 10 at predetermined pressures and temperatures.

There has thus been illustrated a tri-metallic material for use in the manufacture of printed circuit boards. Of particular interest are the various materials is and processes for used in the metallic bonding layer between the first and the second and third strips.

What is claimed is:

1. A tri-metallic material for use in multi-layer printed circuit boards, said material comprising:

a first metallic layer of aluminum having spaced-apart top and bottom broadsides;

a second metallic layer of copper having spaced-apart top and bottom broadsides;

a third metallic layer of copper having spaced-apart top and bottom broadsides; and a noble metal bonding layer deposited on said top and bottom broadsides of said aluminum layer;

said first metallic layer being sandwiched between said copper layers, said copper layers bonded to top and bottom broadsides respectively of said aluminum layer.

2. A tri-metallic material for use in multi-layer printed circuit boards, said material comprising:

a first metallic layer of aluminum-having spaced-apart top and bottom broadsides;

a metallic bonding layer of immersion tin deposited on said top and bottom broadsides of said aluminum layer;

a thin layer of nickel deposited on said immersion tin layer;

a second metallic layer of copper having spaced-apart top and bottom broadsides;

a third metallic layer of copper having spaced-apart top and bottom broadsides; and said first aluminum layer being sandwiched between said second and third copper layers, said second and third copper layers bonded to said nickel layer.

3. A method for bonding aluminum and copper in an etched tri-metal material comprising the steps of:

securing a first aluminum strip having spaced-apart top and bottom broadsides;

securing a second metallic strip of copper having spaced-apart top and bottom broadsides;

securing a third metallic strip of copper having spaced-apart top and bottom broadsides;

the first, second and third strip broadsides having substantially identical planar areas;

depositing a noble metal barrier layer on the broadside surfaces of the first strip or on one broadside surface of each of the second and third strips;

forming a sandwich wherein the second metallic strip of copper and the third metallic strip of copper overlie respectively the top and bottom broadsides of the aluminum strip, such that the barrier layers are not exposed; and then activating the noble metal barrier layers for bonding the mating broadside surfaces of the aluminum strip and to each of the copper strips forming a unitary structure.

4. A method for bonding aluminum and copper in an etched tri-metal material comprising the steps of:

securing a first aluminum strip having spaced-apart top and bottom broadsides;

depositing an immersion tin barrier layer on both broadside surfaces of the aluminum strip;

depositing a nickel layer on each immersion tin barrier layer such that the barrier layer is not exposed;

plating a thin copper layer on both nickel layers; and then
activating the tin barrier layers for bonding the mating broadside surfaces of the aluminum strip and the copper plated layers forming a unitary structure.

5. A method for bonding aluminum and copper in an etched tri-metal material comprising the steps of:

securing an aluminum first metallic strip having spaced-apart top and bottom broadsides;

securing a copper second metallic strip having spaced-apart top and bottom broadsides;

securing a copper third metallic strip having spaced-apart top and bottom broadsides;

depositing a barrier layer selected from the group consisting of chromium, rhodium, palladium and platinum on the broadside surfaces of the aluminum strip or on one broadside surface of each of the copper strips;

forming a sandwich wherein the copper strips overlie respectively the top and bottom broadsides of the aluminum strip, such that the barrier layers are not exposed; and then activating the barrier layers for bonding the mating broadside surfaces of the aluminum strip and the copper strips forming a unitary structure.

* * * * *